United States Patent [19]

Weng

[11] Patent Number: 4,856,003
[45] Date of Patent: Aug. 8, 1989

[54] ERROR CORRECTION CODE ENCODER

[75] Inventor: Lih-Jyh Weng, Lexington, Mass.

[73] Assignee: Digital Equipment Corporation, Maynard, Mass.

[21] Appl. No.: 47,627

[22] Filed: May 7, 1987

[51] Int. Cl.$^4$ .............................................. G06F 11/10
[52] U.S. Cl. ................................................................ 371/37
[58] Field of Search .................... 371/37, 38, 39, 40, 371/2

[56] References Cited

U.S. PATENT DOCUMENTS

| | | | |
|---|---|---|---|
| 4,500,926 | 2/1985 | Yoshimaru | 371/37 X |
| 4,623,999 | 11/1986 | Patterson | 371/37 |
| 4,683,571 | 7/1987 | Yamagishi | 371/37 |
| 4,703,485 | 10/1987 | Patel | 371/37 |

Primary Examiner—Jerry Smith
Assistant Examiner—Robert W. Beausoliel
Attorney, Agent, or Firm—Nutter, McClennen & Fish

[57] ABSTRACT

An encoder encodes a sector of data to produce ECC symbols using a GF($2^{10}$) code by first appending one or more pseudo data bytes to the sector data bytes. The data string of sector data bytes and pseudo data bytes are then encoded to produce a desired number of 10-bit ECC symbols. Two selected bits from each ECC symbol are compared to a known bit pattern. If the selected bits match the pattern, the bits are truncated and the remaining 8-bit symbols are concatenated with the data string to form a codeword. The codeword bytes can later be decoded, and any error correction performed, by appending the bit pattern as necessary. If the selected bits do not match the pattern, the pseudo data bytes are modified such that encoding the data bytes and the modified pseudo data bytes produce 10-bit ECC symbols with the selected bits matching the bit pattern. The selected bits are then truncated and the remaining 8-bit symbols are concatenated with the data string to form the code-word.

16 Claims, 4 Drawing Sheets

TABLE 1. 10-BIT ECC SYMBOL MODIFIER TABLE

| | CONDITION | D1 | S2 | S1 | S0 |
|---|---|---|---|---|---|
| 1. | BIT 1 OF S2 IS 1 | (0010110001) $\alpha^{194}$ | (1000100111) $\alpha^{128}$ | (0010001110) $\alpha^{130}$ | (0000010011) $\alpha^{200}$ |
| 2. | BIT 2 OF S2 IS 1 | (0000110010) $\alpha^{25}$ | (0100111100) $\alpha^{982}$ | (0011111001) $\alpha^{984}$ | (0010011011) $\alpha^{31}$ |
| 3. | BIT 1 OF S1 IS 1 | (0011000000) $\alpha^{83}$ | (0010001001) $\alpha^{17}$ | (1000100100) $\alpha^{19}$ | (0001101100) $\alpha^{89}$ |
| 4. | BIT 2 OF S1 IS 1 | (0011010001) $\alpha^{34}$ | (0001100111) $\alpha^{991}$ | (0110011100) $\alpha^{933}$ | (0000100101) $\alpha^{40}$ |
| 5. | BIT 1 OF S0 IS 1 | (0011011000) $\alpha^{90}$ | (0000011001) $\alpha^{24}$ | (0001100100) $\alpha^{26}$ | (1001100101) $\alpha^{96}$ |
| 6. | BIT 2 OF S0 IS 1 | (0000000100) $\alpha^{2}$ | (0000111000) $\alpha^{959}$ | (0011100000) $\alpha^{961}$ | (0100000000) $\alpha^{8}$ |

FIG. 4

ERROR CORRECTION CODE ENCODER

FIELD OF INVENTION (Modified) Reed-Solomon Error Correction Code Encoder

DESCRIPTION OF PRIOR ART

The importance of error correction coding of data in digital computer systems has increased greatly as the density of the data recorded on mass storage media, more particularly disks, has increased. With higher recording densities, a tiny imperfection in the recording surface of a disk can corrupt a large amount of data. In order to avoid losing that data, error correction codes ("ECC's") are employed to, as the name implies, correct the erroneous data.

Before a string of data symbols is written to a disk, it is mathematically encoded to form ECC symbols. The ECC symbols are then appended to the data string to form code words—data symbols plus ECC symbols—and the code words are written to or stored on the disks. When data is to be read from the disks, the code words containing the data symbols to be read are retrieved from the disks and mathematically decoded. During decoding any errors in the data are detected and, if possible, corrected through manipulation of the ECC symbols [For a detailed description of decoding see Peterson and Weldon, *Error Correction Codes*, 2d Edition, MIT Press, 1972].

Stored digital data can contain multiple independent errors. One of the most effective types of ECC used for the correction of multiple errors is a Read-Solomon code [For a detailed description of Reed-Solomon codes, see Peterson and Weldon, *Error Correction Codes*]. To correct multiple errors in strings of data symbols, Reed-Solomon codes efficiently and effectively utilize the various mathematical properties of sets of symbols known as Galois Fields, represented "$GF(P^q)$", where "P" is a prime number and "q" can be thought of as the number of digits, base P, in each element or symbol in the field. "P" usually has the value 2 in digital computer applications and, therefore, "q" is the number of bits in each symbol.

The number of symbols which an ECC based on a Reed-Solomon code can effectively encode and correct, or "protect", is limited by the size of the Galois Field selected, i.e. $p^q$ symbols, and the maximum number of errors which the code is to be capable of correcting. The maximum length of a cyclic Reed-Solomon code word for $GF(P^q)$ is $P^q-1$ symbols. Thus the maximum number of data symbols which can be protected by the ECC, that is included in the code word, is $P^q-1$ symbols minus "n", where "n" is the number of ECC symbols. The larger the Galois Field, the longer the code word, and the more data the ECC can protect for a given maximum number of errors to be corrected. Therefore, larger Galois Fields could be used to protect larger strings of data symbols. However, using Galois Fields that do not result in 8-bit code word symbols, or symbols that contain a number of bits which is a multiple of eight, complicates the circuitry of the system.

Galois Field $GF(2^8)$ is a Galois Field which results in 8-bit ECC symbols. An ECC based on $GF(2^8)$ can protect a string of up to 253 8-bit data symbols or "data bytes" against a single error, if two 8-bit ECC symbols are appended to the data, making the code word 256 or $2^8$ bytes long. If the ECC is to correct more than one error, more ECC symbols, two for each additional error to be corrected, must be used in the code word. This means that fewer data bytes can be protected for a given length of code word.

Information is often stored on magnetic disks in sectors which are 512 or 576 bytes in length. Therefore, ECC's which are based on $GF(2^8)$ cannot, without complex manipulation of the code, protect an entire 512 or 576 byte sector. ECC's based on $GF(2^{10})$ have sufficient code word length, i.e. $2^{10}$ or 1024 symbols per code word, to protect an entire sector. However, the encoding and decoding of the 10-bit symbols used in a $GF(2^{10})$ code present certain problems.

More specifically, computer transmission and storage hardware is set up for bytes, i.e. 8-bit symbols, or symbols whose length are some multiple of 8-bits. Thus they are, in general, not arranged for manipulation of 10-bit symbols. Therefore, if a $GF(2^{10})$ ECC is to be used, the information has to be translated back and forth between bytes and 10-bit symbols, first for encoding as 10-bit symbols, next for transmission and storage as bytes, and finally for decoding as 10-bit symbols. The requirement of translating between bytes and 10-bit symbols at both the encoder and the decoder adds the complexity of another step to the ECC coding process.

One technique which is used to protect an entire 512 or 576 byte sector with a $GF(2^8)$ ECC is to interleave the ECC $GF(2^8)$ code several times. Interleaving effectively splits the the string of data symbols into several smaller segments, and treats each segment as a stream of data symbols to be encoded. The benefits of interleaving are that it permits a larger number of data symbols to be encoded by a given code, and that it effectively separates bursts of errors by encoding adjacent data symbols in different code words. On the other hand, interleaving typically involves two steps to encode, first dividing the data to be encoded into several segments and then separately encoding each segment into a code word; and two steps to decode, first separately decoding the data and then combining the data symbols to recreate the original string of data symbols. Also, interleaving results in a less efficient code. Interleaved codes require more ECC symbols to protect the data from a given number of errors than are required by a non-interleaved code.

SUMMARY OF THE INVENTION

The invention enables one to generate a code word in $GF(2^{10})$ to protect up to 1023 bytes (data plus ECC symbols) and yet use 8-bit symbols, or bytes, as the ECC symbols. First, one or more predetermined pseudo data bytes are appended to the data bytes and the string comprised of the data bytes plus the pseudo data bytes is encoded to produce the desired number of 10-bit ECC symbols. Then, two selected bits in each of the 10-bit ECC symbols are compared to a known 2-bit pattern, e.g. "00". If the selected two bits in each of the 10-bit ECC symbols are the same as the 2-bit pattern, the selected bits of the ECC symbols are ignored or truncated and the remaining 8 bits of each of the ECC symbols are concatenated with the data bytes and the appended pseudo data bytes to form the code word. The code word bytes can later be decoded, and any error correction performed, by appending the known 2-bit truncation pattern as necessary for Galois Field addition and/or multiplication.

If any of the selected bits in any of the ECC 10-bit symbols are not the same as the truncation pattern, the appended pseudo data bytes are modified such that encoding the data bytes plus the modified pseudo data bytes produces 10-bit ECC symbols with the selected bits the same as the truncation pattern. Then the selected bits, which are now the same as the known truncation pattern, are ignored and the remaining 8 bits of each of the ECC symbols and the modified pseudo data bytes are stored along with the data bytes as the code word. Again, the modified pseudo data bytes and the remaining 8-bits of the ECC symbols contain all the information necessary to allow the decoding and error correction of the code word as bytes.

The modification of the pseudo data bytes and the determination of the 8 bits of the ECC symbols which are not the preselcted, or known, 2 bits are easily made according to a pre-stored table.

DESCRIPTION OF THE DRAWINGS

This invention is pointed out with particularity in the appended claims. The above and further advantages of this invention may be better understood by referring to the following description taken in conjunction with the accompanying drawing, in which:

FIG. 4 is a modifier table generated in accordance with the preferred embodiment.

DETAILED DESCRIPTION

Figure 1:
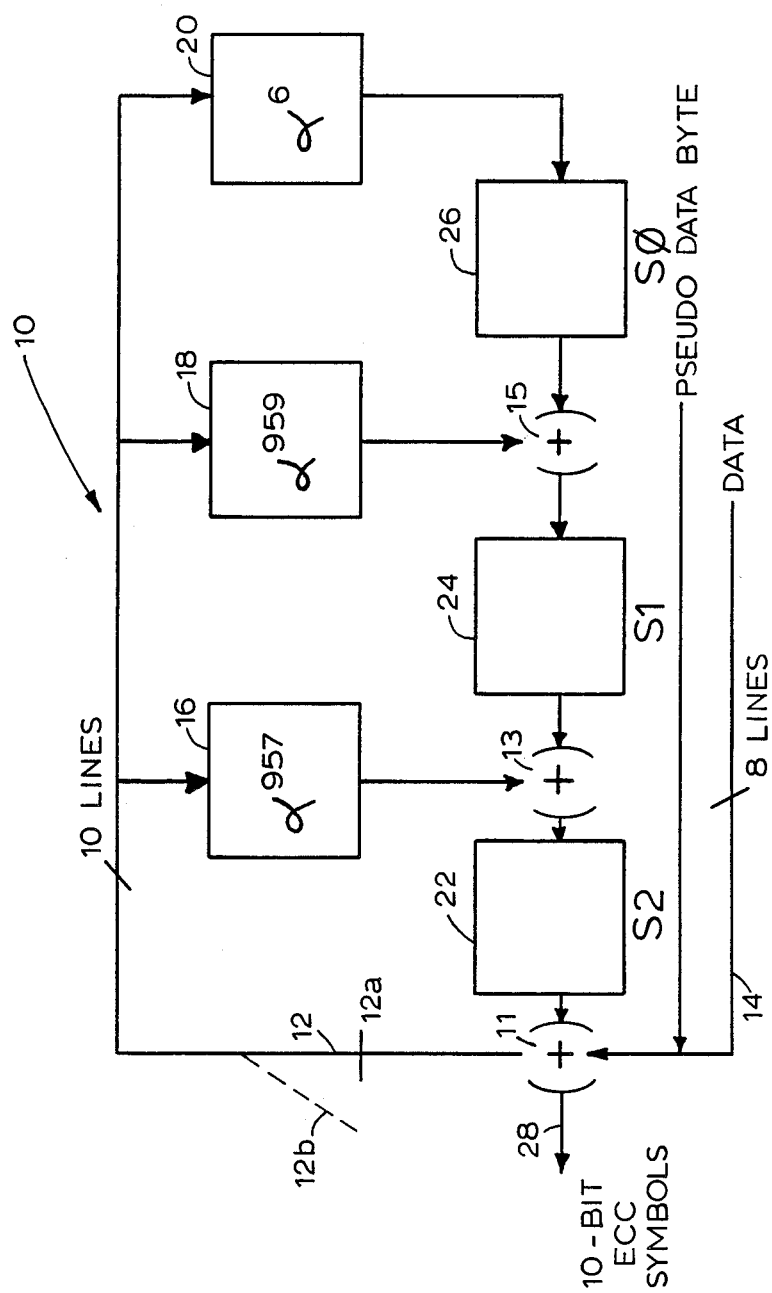
FIG. 1 is a functional block diagram of an encoder which provides error correction symbols in accordance with the preferred error correction code. The encoder operates to accept a number of 8-bit data bytes plus an appended 8-bit pseudo data byte and produce 10-bit ECC symbols.

The Galois Field $GF(2^{10})$ is based on the primitive polynomial $p(x) = x^{10} + x^3 + 1$. Each of the $2^{10}$ elements of $GF(2^{10})$ is denoted $\alpha^i$ where $i = 0, 1, 2, \ldots, 1023$. The generator polynomial for the Reed-Solomon code over $GF(2^{10})$ is of the form:

$$g(x) = (x + (\alpha^i)^m) * (x + (\alpha^i)^{m+1}) * (x + (\alpha^i)^{m+2}) \quad (1)$$

where m and i are somewhat arbitrary numbers selected according to the number of ECC symbols utilized, with the limitation that $i$ cannot equal ZERO. The number of factors in the generator polynomial is determined by the number of errors which the code is designed to correct and the encoder used.

The example set forth below is a code which designed to either detect three errors or correct one error and detect two errors, i.e. it has three ECC symbols. Letting $i = 1$ and $m = 1$, the generator polynomial $g(x)$ is $$g(x) = (x + \alpha^1) * (x + \alpha^2) * (x + \alpha^3), \quad (2)$$

which, when expanded using $GF(2^{10})$ multiplication, i.e. modulo $p(x)$, and $GF(2^{10})$ addition, i.e. modulo 2, provides $$g(x) = x^3 + (\alpha^{957})x^2 + (\alpha^{959})x + \alpha^6. \quad (3)$$

The number of pseudo data symbols required for the code is determined by the number of ECC symbols used in the code, the number of bits in the truncation pattern, i.e, the number of bits in the ECC symbols minus the number of bits in the code word symbols, and the number of bits in the code word pattern. The formula is $$\frac{(\# \text{ ECC symbols}) * (\# \text{ bits in the truncation pattern})}{(\# \text{ bits in code word symbols})} \quad (4)$$

where "#" is an abbreviation for number, and the number of pseudo data symbols required is the integer portion of the quotient, rounded off to the next highest integer for any remainder. Thus a $GF(2^{10})$ code with three ECC symbols, eight-bit symbols in the code word and therefore a two-bit truncation pattern requires one pseudo data symbol:

$$\frac{(3) * (2)}{(8)}$$

Figure 3:
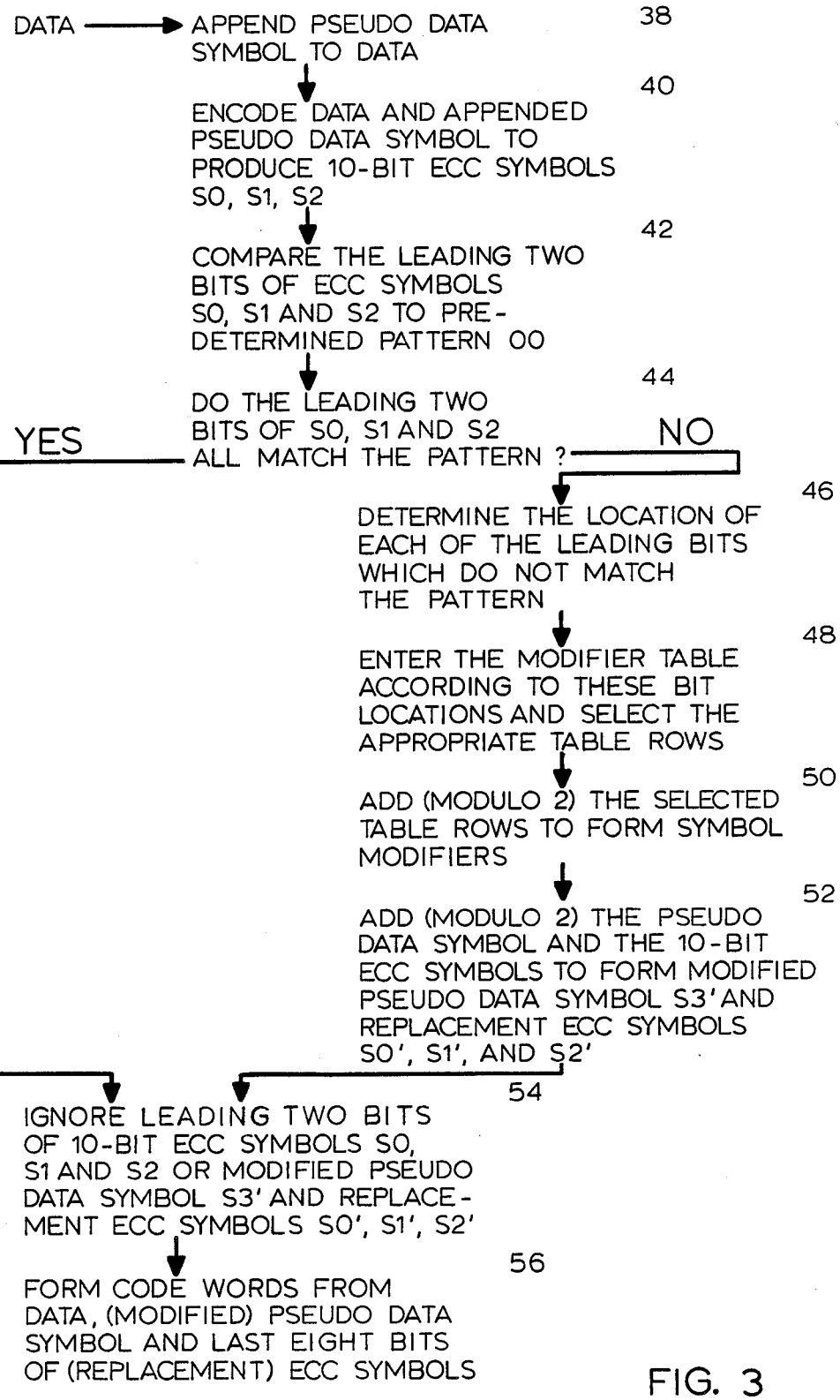
FIG. 3 is a flow chart of the steps involved in operation of the preferred embodiment.

With three ECC symbols, the coefficients of the generator polynomial (3) can be used in the encoder 10 shown in FIG. 1 to encode up to a total of 1020 bytes, i.e. data bytes plus the predetermined appended pseudo data bytes (steps 38 and 40, FIG. 3). In this example, K data bytes are encoded, and one pseudo data byte is appended. The K data bytes plus the appended pseudo data byte are hereinafter referred to collectively as the "K+1 data bytes". The appended pseudo data byte used in this example is the all ZERO byte (00000000).

With reference to FIG. 1, the encoder 10 includes a set of 10-bit registers 22, 24, and 26 that are cleared prior to the encoding operation. The contents of the registers are applied to exclusive OR circuits (XOR's) 11, 13 and 15, respectively. The input to the encoder is applied to the XOR 11 in byte serial, bit parallel fashion over eight input lines 14.

During the input operation a switch 12 is in the position 12a so that the output of the XOR 11 is applied to Galois Field multipliers 16, 18 and 20. The outputs of multipliers 16 and 18 are applied to XOR's 13 and 15, respectively and the output of multiplier 20 is applied to the register 26. The Galois Field multipliers 16–20 multiply their inputs by the factors $\alpha^{957}$, $\alpha^{959}$ and $\alpha^6$ respectively.

Figure 2:
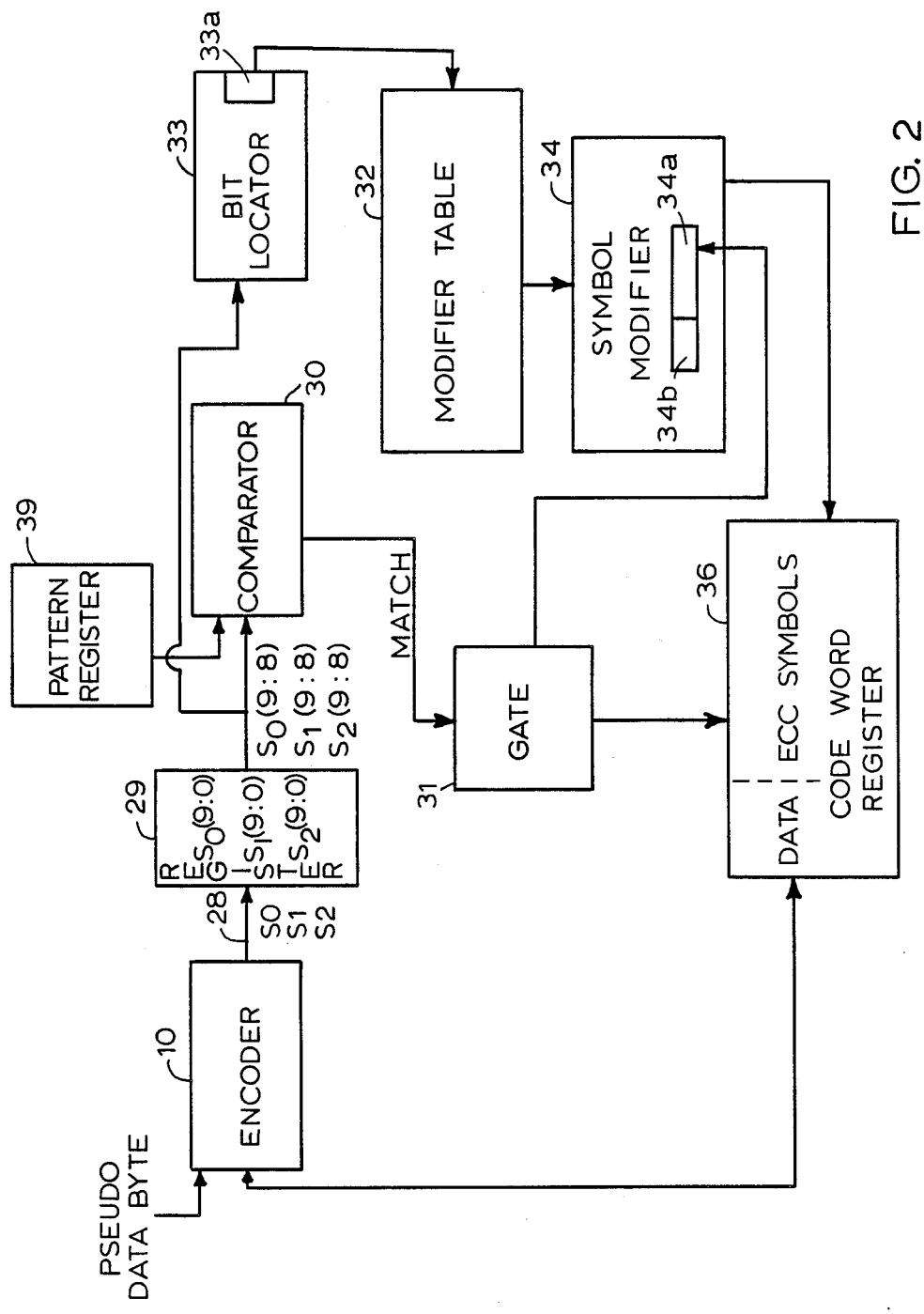
FIG. 2 is a functional block diagram of an encoding system constructed in accordance with the preferred embodiment of the invention. The system produces code words containing 8-bit ECC symbols using $GF(2^{10})$ encoding.

Accordingly, as each input byte is applied to the encoder 10, it is summed (modulo 2) with the contents of the register 22, with two leading ZERO bits appended to the input bytes as necessary for modulo 2 addition. The sum is then simultaneously multiplied (modulo $p(x)$) by Galois Field multipliers 16–20 which contain the coefficients of all but the highest power of X in g(X). The respective products of the byte and the coefficients are then added (modulo 2) to the contents of the registers 22–26. After all of the K+1 data bytes have been applied to the encoder 10 (the timing circuitry to apply the pseudo data byte to the encoder after all data bytes have been applied is not shown), the encoder switch 12 is placed in position 12b and the contents of registers 22–26 are unloaded as the 10-bit ECC symbols S2, S1, and S0 by shifting their contents to the left (FIG. 1) to an output terminal 28. The ECC symbols are then stored in register 29 (FIG. 2). It will be noted that during the shifting operation, with the switch 12 in the position 12b and with a zero input on the lines 14, the vertical inputs of the XOR's therefore pass the contents of the registers 22-26 without modifying them. It will be further noted that encoders of this type are well known in the art.

As a simple example, assume a string of two data bytes, (00000001) and (00000010). The following string of bytes is loaded into the encoder:

(00000001) (00000010) (00000000)
/------ K data bytes------/- -pseudo data byte- -/

After generation of the error correction code in the encoder 10, the contents of the registers 22-26 are unloaded to provide the 10-bit ECC symbols S2, S1, and S0:

$S2 = \alpha^{237} = (1111000000)$
$S1 = \alpha^{207} = (0110010010)$
$S0 = \alpha^{966} = (0000111111)$.

Next, the selected two bits of the 10-bit ECC symbols stored in the register 29 are loaded in paralled into a comparator 30 (FIG. 2) and compared with a predetermined 2-bit truncation pattern stored in a register 39. In this example, the selected bits are the leading two bits, and the predetermined truncation pattern is "00". If each symbol had "00" as the leading two bits, the comparator 30 would provide a "match" signal to a gate 31. The gate 31 would then pass the remaining eight bits of each of the ECC symbols to a code word register 36 which would append them, along with the pseudo data byte, to the data string to form the code word (steps 42, 54, 56, FIG. 3). However, the leading two bits of S1 and S2 are not both ZEROS. The pseudo data byte must therefore be modified in a modifier 34 such that encoding the data bytes and the modified pseudo data byte will result in 10-bit ECC symbols which each have "00" as the leading two bits. The last eight bits of each ECC symbol can then be used in forming the code word (Steps 42-56, FIG. 3) in code word register 36.

The modification of the pseudo data byte and the determination of the resulting ECC symbols are made in accordance with a modifier table 32 whose contents are set forth in Table 1, FIG. 4. (The generation of the table will be described below). Comparator 30 provides a "no match" signal which enables a bit locator 33. Bit locator 33 then locates any of the leading two bits in S0, S1 and S2 which are ONES. This information is used in the table entry logic 33a contained in the bit locator 33 to enter the modifier table 32 and select rows from the table. The selected table rows are then combined in a symbol modifier 34 as described below and used to modify the pseudo data byte and the ECC symbols. For the generator polynomial (3), Table 1 is the modifier table. Column D1 in Table 1 contains modifiers for the pseudo data byte and columns S0, S1 and S2 contain the modifiers for S0–S2, respectively.

In this example conditions 1, 2 and 4 of Table 1 have been met, and the table is therefore entered in rows 1, 2 and 4. The modifiers of the symbols S0, S1, S2, D1 are formed in symbol modifier 34 by adding together (modulo 2) the corresponding entries in these rows (step 50, FIG. 3):

|  | D1 | S2 | S1 | S0 |
| --- | --- | --- | --- | --- |
| condition 1 - | (0010110001) | (1000100111) | (0010001110) | (0000010011) |
| condition 2 - | (0000110010) | (0100111100) | (0011111001) | (0000100101) |
| condition 4 - | (0011010001) | (0001100111) | (0110011100) | (0000100101) |
| modifiers - | (0001010010) | (1101111100) | (0111101011) | (0010101101) |

The pseudo data byte, which is stored in a register 34b in symbol modifier 34, and the ECC symbols, which are loaded into a register 34a in symbol modifier 34 through gate 31 in response to the "no match" signal from comparator 30, are then modified in symbol modifier 34 by adding (modulo 2) the modifiers to the original symbols to form symbols S0', S1', S2' and D1' (step 52, FIG. 3). These replace the symbols S0–S2 and the pseudo data byte (i.e. D1').

$D1' = (0000000000) + (0001010010) = (0001010010) = \alpha^{519}$
$S2' = (1111000000) + (1101111100) = (0010111100) = \alpha^{862}$
$S1' = (0110010010) + (0111101011) = (0001111001) = \alpha^{133}$
$S0' = (0000111111) + (0010101101) = (0010010010) = \alpha^{315}$ The first two bits of D1', S2', S1', S0', which are all ZEROS, are ignored for transmission or storage (step 54, FIG. 3) and the resulting code word loaded into code word register 36 is:

(00000001) (00000010) (01010010) (10111100) (01111001) (10010010)
                                  $\alpha^{862}$      $\alpha^{133}$   $\alpha^{315}$ /------- -data- ------/-pseudo data byte-/--------- -ECC symbols --------- /

The code word can thus be transmitted or stored as a string of bytes.

Decoding of the code word at the receiving end is simpler than encoding because the modifier table is not needed. The residues of the transmitted code word, which are needed for error detection, are determined by encoding (FIG. 1) the K data bytes and the pseudo data byte of the received code word. At this point, the pseudo data byte can be discarded. The generated ECC symbols and the ECC symbols in the code word can then be compared and if any errors are detected, an error correction algorithm can be employed.

I shall now describe two methods that can be used to generate Modifier Table 1 and then take up the more general case of modifier tables for codes with multiple pseudo data symbols. The first method for generating Table 1 starts with an arbitrary selection of potential first column (D1) entries from all the possible GF($2^{10}$) symbols which have ZEROS as the leading two bits (i.e. symbols containing the truncation pattern)—there are 256 possible first column entries. Next, each of the potential first column entries is encoded using the encoder 10 (FIG. 1) to produce corresponding potential table rows, i.e. entries for S0–S2. Two table rows per ECC symbol, one corresponding to each of the selected bits in the truncation pattern, are chosen from the potential table rows. Thus, with three ECC symbols and two bits in the truncation pattern in this example, six rows are selected.

Specifically, two table rows for the ECC symbol S0 are chosen such that all the entries in the rows have ZEROS as the leading two bits, i.e. the truncation bits equal to the truncation pattern, except for the entries in the column corresponding to the S0 symbol. One of these S0 entries must have one of the truncation bits, E, equal to ONE and the other truncation bit, F, in the same entry equal to ZERO, i.e, truncation bit E is the additive inverse of the corresponding bit in the truncation pattern and the truncation bit F is equal to the corresponding bit in the truncation pattern. The other row must have an S0 entry with truncation bit F equal to the additive inverse of the corresponding truncation pattern bit and truncation bit E equal to the corresponding bit in the truncation pattern. Using the corresponding row selection criteria, rows are also selected for the ECC symbols S1 and S2.

As an example, consider the rows in Table 1 corresponding to S1, namely rows 3 and 4. The row 3 entries have ZEROS in the first two bit positions of each entry except for the entry in the S1 column, which has a ONE in the leading bit position and a ZERO in the second bit position. Similarly, the row 4 entries have ZEROS in the first two bit positions of each entry except for the entry in the S1 column, which has a ZERO in the leading bit position and a ONE in the second bit position.

If two tables rows satisfying the row selection criteria could not be found for each ECC symbol, the generator polynomial selected for the code could not then be used. Alternate values for m and/or i in generator polynomial (1) would then be chosen until a generator polynomial were found from which a modifier table could be constructed. This generator polynomial would then be used in encoder 10.

The second method to generate Table 1 utilizes the generator polynomial (3). The leading two bits of the coefficients in (3) are used as the first row of what will become a "dc by c" matrix ("Matrix A"), where d is the number of pseudo data symbols determined by equation (4) and c is the number of bits in the code word symbols. In this example, Matrix A is an "8 by 8" matrix. Next, the generator polynomial (3) is multiplied by $\alpha^i$, i=1, 2, ... 7, and the leading two bits of the coefficients of each of the product polynomials, $\alpha^i[g(x)]$, are used as the elements of rows two through seven of Matrix A. Then a "pseudo inverse", Matrix B, of Matrix A is generated, using the method of row reduction, to put Matrix A in a form that is as close as possible to the identity matrix. In this way the rank R of Matrix A, i.e. the number of rows of the matrix which can be manipulated to form rows resembling the rows of the identity matrix, can be determined. Matrix B, which is not unique unless Matrix A is a square matrix, is determined such that for each row $a_i$ of Matrix A and each row $b_i$ of Matrix B, the inner product, $a_i*b_i$, $$a_i*b_i = 1, i = j$$
$$a_i*b_i = 0, i \neq j$$

If the rank R of Matrix A is equal to the number of rows required in the modifier table, then the R rows of Matrix B are used as the last eight bits of each of the entries in the first, or D1, column of the table (the first two bits are always ZEROS, i.e. the truncation bits are equal to the truncation pattern). These first column entries are then separately encoded by encoder 10 to create the table rows.

If the rank R of Matrix A does not equal the number of rows required for the modifier table, another generator polynomial (1) is chosen, i.e. the values of m and/or i are varied, such that a modifier table can be created. Usually it would be sufficient to vary i only.

The storage requirements of the modifier table may be reduced to just the D1 column. The modifiers for S0, S1, and S2 can be found by encoding (FIG. 1) the D1 modifier. The D1 modifier is found by appropriately entering the D1 modifier column. After encoding the D1 modifier, the contents of the registers 22-26 will be the modifiers for S0, S1 and S2.

The two methods outlined above can be used in expanded form to generate modifier tables for codes using a different size Galois Field and/or using more than one pseudo data symbol. In the general case, there are (i) an arbitrary number s of ECC symbols depending on the maximum number of errors the code is designed to correct; (ii) an arbitrarily large Galois Field GF ($P^q$), depending on the size of the data field to be protected, where P is usually equal to 2 and elements of the field have q bits; (iii) code word symbols with c bits, where c is less than q; and (iv) truncation patterns b bits long, where b is equal to q−c. The number d of pseudo data symbols required for a code is determined by equation (4) to be $$d = \frac{s*b}{c}$$

Therefore, to generate such a modifier table using the first method described above, elements of GF ($2^q$) having truncation bits identical to the truncation pattern are arbitrarily selected—there are $2^b$ such elements. The selected elements are then encoded by the generator polynomial to generate potential table row entries for the s ECC symbols and the first pseudo data symbol (D1). Next all-ZERO entries are inserted in the potential table rows before D1 for the second (D2), third (D3), etc. pseudo data symbols and table rows satisfying the table selection criteria are selected from these potential table rows.

If the approriate number of table rows, b, satisfying the row selection criteria for each ECC symbol can be obtained, only one pseudo data symbol is required for the code. If the appropriate number of table rows cannot be obtained, a series of iterations is performed as described below. If the appropriate number of table rows cannot be obtained after the series of iteration, the generator polynomial (1) must be modified.

In the first iteration a string t of two symbols, namely (00000001) and (00000000), is encoded by dividing it by the generator polynomial as in encoder 10 of FIG. 1. This produces a polynomial f(x) which is of the form:

$$f(x) = x^a + 0x^b + \alpha^u x^c + \alpha^v x^d + \alpha^w x + \alpha^y \qquad (5)$$

Next, potential first column entries are arbitrarily selected as set forth above and corresponding potential table row entries are generated by encoding them, that is, multiplying them, by f(x). Potential table rows are then formed using these entries for the ECC symbols and the first two pseudo data symbols (D1 and D2) and using all-ZERO symbols as entries for the remaining pseudo data symbols. Next, additional table rows satisfying the row selection criteria are selected from these potential table rows.

If the appropriate number of table rows are still not found, a second iteration is performed. In this iteration, a string t' of three symbols is encoded, namely (00000001), (00000000) and (00000000). Then the potential rows are generated and appropriate table rows are selected as described above. If the table still cannot be obtained, additional iterations can be performed by appending additional all-ZERO symbols to the string of symbols t' previously encoded and then following the potential row generation and table row selection steps described above.

There is a limit, equal to $d-1$, on the number of iterations that can be performed. If the modifier table cannot be generated after $d-1$ iterations, the generator polynomial must be modified and the iterations performed with the modified generator polynomial until the table can be generated.

Another method to generate a modifier table for codes with more than one pseudo data symbol is an expanded matrix method. This method is performed as follows: The first c rows of the Matrix A are generated as described in the matrix method for generating, Table 1, using b bits of the polynomial coefficients and using all-ZERO entries for the second (D2), third (D3), etc. pseudo data symbols. The next c rows are generated in the same manner using polynomial (5), i.e. the leading b bits of the coefficients of polynomial (5) are used as the entries of row $c+1$ of the matrix, polynomial (5) is then multiplied by $\alpha^i$, $i=1, 2, \ldots, c-1$, and the leading b bits of the respective coefficients are used as the entries of rows $c+2$ through $2c$ of the matrix. This matrix row generation process is repeated by encoding the various strings of symbols t, t', etc., until a "dc by c" matrix is obtained. Again the "pseudo inverse" of the matrix is generated, the rank is determined and, if the rank is equal to the number of rows required in the modifier table, the table is generated from this matrix as set forth above.

If the rank of the matrix A is not equal to the number of rows required in the modifier table, the generator polynomial (1) must be modified. Usually the value of i is varied until a generator polynomial from which the modifier table can be generated is determined.

I claim:

1. A method for encoding data symbols into code words using a modified Reed-Solomon error correction code ("ECC") over Galois Field ($p^q$) and a generator polynomial g(x) which has q-bit coefficients which are elements of the Galois Field such that a maximum of d errors can be corrected, said method comprising the steps of:
   1. encoding K data symbols plus L predetermined pseudo data symbols to produce d q-bit ECC symbols;
   2. ascertaining whether n selected bits in each of said q-bit ECC symbols match a predetermined truncation pattern, and if any of said selected bits do not match the corresponding bits in said truncation pattern, ascertaining the location of the non-matching bits; and
   3. (a) in response to a determination that said selected n bits in each of said q-bit ECC symbols match said pattern, forming a code word containing said K data symbols, said L psuedo data symbols and d ECC symbols, each of which is formed from the q-n bits of a q-bit ECC symbol which are not said selected bits,
   (b) in response to a determination that said selected n bits in at least one of said q-bit ECC symbols do not match said pattern,
      1. modifying said predetermined pseudo data symbols to provide L modified pseudo data symbols such that encoding a string consisting of the data symbols and the modified pseudo data symbols will produce q-bit replacement ECC symbols in which said selected n bits of each of said replacement ECC symbols match said pattern, and
      2. forming a code word containing said K data symbols, said L modified psuedo data symbols and d ECC symbols, each of which is formed from the q-n bits of a q-bit replacement ECC symbol which are not the selected bits.

2. The encoding method as recited in claim 1 wherein said modifying step further comprises:
   1. selecting one or more rows of entries in a modifier table for each q-bit ECC symbol in response to the location of each of said selected n bits of said d q-bit ECC symbols which does not match the corresponding bit in said predetermined n-bit pattern;
   2. forming L pseudo data symbol modifiers and d q-bit ECC symbol modifiers by adding, modulo p, said selected table rows, such that the column entries in each of said selected table rows are added to the corresponding entries in each of the other selected table rows; and
   3. modifying said L pseudo data symbols and said q-bit ECC symbols by adding, modulo p, said pseudo data symbol modifiers and said ECC symbol modifiers to corresponding ones of said pseudo data symbols and said ECC symbols.

3. The method recited in claim 2 wherein said modifier table consists of nd rows and $d+L$ columns, with the first L columns being associated with respect ones of said L pseudo data symbols and one column being associated with each of said d ECC symbols, said table being generated by:
   i. selecting, from each of the q-bit coefficients of g(x), n element bits which have the same bit positions as said n selected bits of said q-bit ECC symbols, using the element bits as nd elements of the bottom row of an "(L)(q-n) by q-n" matrix, and using all ZEROS for the remaining bottom row elements,
   ii. multiplying (modulo p(x)) each of said coefficient symbols by $\alpha$, the primitive element of Galois Field ($p^q$), to provide modified coefficients,
   iii. using the element bits of said modified coefficients as the nd elements of the next row of said matrix and using all-ZEROS for the remaining row elements,
   iv. repeating steps ii and iii until said matrix contains q-n rows.

4. The method of claim 1 wherein the Galois Field GP ($p^q$) is selected such that a block of data consisting of 512 or 576 data symbols can be encoded.

5. The method of claim 1 wherein the Galois Field is $GF(2^{10})$ and the predetermined truncation pattern is two bits long such that the data symbols and the code word ECC symbols are eight bits long.

6. The method of claim 5 wherein the predetermined pattern consists of two ZEROS in the leading two symbol bit positions.

7. An apparatus for encoding data symbols into code words using a modified Reed-Solomon error correction code ("ECC" over Galois Field ($p^q$) and a generator polynomial g(x) which has q-bit coefficients which are elements of the Galois Field, such that a maximum of d errors can be corrected, said apparatus comprising:

A. means for encoding K data symbols plus L predetermined pseudo data symbols to produce d q-bit ECC symbols;

B. means for ascertaining whether n selected bits in each of said q-bit ECC symbols match a truncation pattern, and if any of said selected bits do not match the corresponding bits in said truncation pattern, ascertaining the location of the non-matching bits; and C. (1) in response to a determination that said selected n bits in each of said q-bit ECC symbols match said pattern, means for forming a code word containing said K data symbols, said L psuedo data symbols and d EEC symbols, each of which is formed from the q−n bits of a q-bit ECC symbol which are not said selected bits, (2) in response to a determination that said selected n bits in at least one of said q-bit ECC symbols do not match said pattern, 1. modifying means for modifying said predetermined pseudo data symbols to provide L modified pseudo data symbols such that encoding a string consisting of the data symbols and the modified pseudo data symbols will produce q-bit replacement ECC symbols in which said selected n bits of each of said replacement ECC symbols match said pattern, and 2. means for forming a code word containing said K data symbols, said L modified psuedo data symbols and d ECC symbols, each of which is formed from the q−n bits of a q-bit replacement ECC symbol which are not the selected bits.

8. The encoding apparatus as recited in claim 7 wherein said modifying means further comprises:

A. means for selecting one or more rows of entries in a modifier table for each q-bit ECC symbol in response to the location of each of said selected n bits of said q-bit ECC symbols which does not match the corresponding bit in said predetermined n-bit pattern;

B. means for forming L pseudo data symbol modifiers and d q-bit ECC symbol modifiers by adding, modulo p, said selected table rows, such that the column entries in each of said selected table rows are added to the corresponding entries in each of the other selected table rows; and C. means for modifying said L pseudo data symbols and said q-bit ECC symbols by adding, modulo p, said pseudo data symbol modifiers and said ECC symbol modifiers to corresponding ones of said pseudo data symbols and said ECC symbols.

9. The apparatus of claim 7 wherein the Galois Field GF (p$^q$) is selected such that a block of data consisting of 512 or 576 data symbols can be encoded.

10. The apparatus of claim 7 wherein the Galois Field is GF($2^{10}$) and the predetermined pattern is two bits long such that the data symbols and the ECC symbols are eight bits long.

11. The apparatus of claim 10 wherein the predetermined pattern consists of two ZEROS in the leading two symbol bit positions.

12. A method for encoding data symbols into code words using a modified Reed-Soloman error correction code ("ECC") over Galois Field (p$^q$) and a generator polynomial g(x) which has q-bit coefficients which are elements of the Galois Field such that a maximum of d errors can be corrected, said method comprising the steps of:

1. encoding K data symbols plus L predetermined pseudo data symbols to produce d q-bit ECC symbols;

2. ascertaining whether n selected bits in each of said q-bit ECC symbols match a predetermined truncation pattern, and if any of said selected bits do not match the corresponding bits in said truncation pattern, ascertaining the location of the non-matching bits; and 3. (a) in response to a determination that said selected n bits in each of said q-bit ECC symbols match said pattern, forming a code word containing said K data symbols, said L pseudo data symbols and d ECC symbols, each of which is formed from the q−n bits of a q-bit ECC symbol which are not said selected bits, (b) in response to a determination that said selected n bits in at least one of said q-bit ECC symbols do not match said pattern;

1. modifying said predetermined pseudo data symbols to provide L modified pseudo data symbols such that encoding a string consisting of the data symbols and the modified pseudo data symbols will produce q-bit replacement ECC symbols in which said selected n bits of each of said replacement ECC symbols match said pattern by:

i. selecting one or more rows of entries in a modifier table for each q-bit ECC symbol in response to the location of each of said selected n bits of said d q-bit ECC symbols which does not match the corresponding bit in said predetermined n-bit pattern, ii. forming L pseudo data symbol modifiers and d q-bit ECC symbol modifiers by adding, modulo p, said selected table rows, such that the column entries in each of said selected table row are added to the corresponding entries in each of the other selected table rows, iii. modifying said L pseudo data symbols and said q-bit ECC symbols by adding, modulo p, said pseudo data symbol modifiers and said ECC symbol modifiers to corresponding ones of said pseudo data symbols and said ECC symbols, and 2. forming a code word containing said K data symbols, said L modified pseudo data symbols and d ECC symbols, each of which is formed from the q−n bits of a q-bit replacement ECC symbol which are not the selected bits.

13. The method recited in claim 12 wherein said modifier table consists of nd rows and d+L columns, with the first L columns being associated with respective ones of said L pseudo data symbols and one column being associated with each of said d ECC symbols, said table being generated by:

A. selecting potential d+1 column entries, where the d+1 column is associated with the first pseudo data symbol, for said modifier table from the elements of GF(p$^q$) such that the selected n bits of each potential d+1 column entry match said truncation pattern;

B. separately encoding said potential d+1 column entries by steps 1-3 of claim 12, thereby to produce d code symbols corresponding to each of said potential d+1 column entries such that each potential d+1 column entry together with all ZERO entries for the remaining L−1 pseudo data symbols and the d code symbols form potential table rows; and C. selecting table rows from said potential table rows such that
   i. each ECC symbol has n rows associated with it,
   ii. in each of said n rows, the code symbol in the column associated with the ECC symbol has one of said n selected bits which does not match said truncation pattern, and
   iii. each of said n rows has a different one of said selected n bits which does not match said truncation pattern.

14. An apparatus for encoding data symbols into code words using a modified Reed-Soloman error correction code ("ECC") over Galois-Field ($p^q$) and a generator polynomial g(x) which has q-bit coefficients which are elements of the Galois Field, such that a maximum of d error can be corrected, said apparatus comprising:
A. means for encoding K data symbols plus L predetermined pseudo data symbols to produce d q-bit ECC symbols;
B. means for ascertaining whether n selected bits in each of said q-bit ECC symbols match a truncation pattern, and if any of said selected bits do not match the corresponding bits in said truncation pattern, ascertaining the location of the non-matching bits; and
C. (1) in response to a determination that said selected n bits in each of said q-bit ECC symbols match said pattern, means for forming a code word containing said K data symbols, said L pseudo data symbols and d ECC symbols, each of which is formed from the q−n bits of a q-bit ECC symbol which are not said selected bits,
   (2) in response to a determination that said selected n bits in at least one of said q-bit ECC symbols do not match said pattern, means for modifying said q-bit ECC symbols including:
   1. modifying means for modifying said predetermined pseudo data symbols to provide L modified pseudo data symbols such that encoding a string consisting of the data symbols and the modified pseudo data symbols will produce q-bit replacement ECC symbols in which said selected n bits of each of said replacement ECC symbols match said pattern, said modifying means including:
      i. means for selecting one or more rows of entries in a modifier table for each q-bit ECC symbol in response to the location of each of said selected n bits of said d q-bit ECC symbols which does not match the corresponding bit in said predetermined n-bit pattern,
      ii. means for forming L pseudo data symbol modifiers and d q-bit ECC symbol modifier by adding, modulo p, said selected table rows, such that the column entries in each of said selected table rows are added to the corresponding entries in each of the other selected table rows,
      iii. means for modifying said L pseudo data symbols and said q-bit ECC symbols by adding, modulo p, said pseudo data symbol modifiers and said ECC symbol modifiers to corresponding ones of said pseudo data symbols and said ECC symbols; and
   2. means for forming a code word containing said K data symbols, said L modified pseudo data symbols and d ECC symbols, each of which is formed from the q−n bits of a q-bit replacement ECC symbols which are not the selected bits.

15. The apparatus recited in claim 14 wherein said modifier table consists of nd rows and d+L columns, with the first L columns being associated with respective ones of said L pseudo data symbols and one column associated with each of said d ECC symbols, said table being generated by:
A. selecting potential d+1 column entries, where the d+1 column is associated with the first pseudo data symbol, for said modifier table from the elements of $GF(p^q)$ such that the selected n bits of each potential d+1 column entry match said truncation pattern;
B. separately encoding said potential d+1 column entries by the same apparatus used to encode in claim 14, thereby to produce d code symbols corresponding to each of said potential d+1 column entries such that each potential d+1 column entry together with all-ZERO entries for the remaining L−1 pseudo data symbols and the d code symbols form potential table rows;
C. selecting table rows from said potential table rows such that
   i. each ECC symbol has n rows associated with it,
   ii. in each of said n rows, the code symbol in the column associated with the ECC symbol has one of said n selected bits which does not match said truncation pattern;,
   iii. each of said n rows has a different one of said selected n bits which does not match said truncation pattern;
D. if L is greater than one, encoding by the same apparatus used to encode in claim 14 a symbol string S of two q-bit symbols with a first q-bit symbol consisting of q−1 ZEROS followed by a ONE and a second q-bit symbol consisting of all ZEROS, to produce a polynomial f(x);
E. selecting potential d+2 column entries for said modifier table, where the d+2 column is associated with the second pseudo data symbol, as in step A;
F. separately encoding said potential d+2 column entries by multiplying said potential entries by said polynomial f(x) to produce d+1 code symbols corresponding to each of said potential d+2 column entries such that each potential d+2 column entry together with all zero entries for the remaining L−2 pseudo data symbols and the d+1 code word symbols form potential table rows;
G. selecting table rows from said potential table rows as in step C;
H. if L is greater than two, encoding by the same apparatus used to encode claim 14 a symbol string S' of three q-bit symbols with the first two symbols the same as the symbols in said symbol string S and the third symbol consisting of all ZEROS to produce a polynomial f'(x);
I. selecting potential d+3 column entries for said modifier table, where the d+3 column is associated with the third pseudo data symbol, as in step A;
J. repeating step F, substituting f'(x) for f(x), to produce potential table rows for each of said d+3 potential column entries as in step F;
K. selecting table rows from said potential table rows as in step C;
L. repeating steps H through K, with said symbol string S' being lengthened by one all-ZERO symbol with each repetition, until nd table rows have been selected.

16. The apparatus recited in claim 14 wherein said modifier table consists of nd rows and d+L columns, with the first L columns being associated with respective ones of said L pseudo data symbols and one column being associated with each of said d ECC symbols, said table being generated by:

A. selecting from each of the q-bit coefficients of g(x), n element bits which have the same bit positions as said n selected bits of said q-bit ECC symbols, using the element bits as nd elements of the bottom row of a matrix, and using all-ZEROS for the remaining bottom row elements;

B. multiplying (modulo p(x)) each of said coefficient symbols by $\alpha$, the primitive element of Galois Field ($p^q$) to provide modified coefficients;

C. using the element bits of said modified coefficients as the nd elements of the next row of said matrix, and using all-ZEROS for the remaining row elements;

D. repeating steps B and C until said matrix contains q-n rows;

E. if L is greater than one, encoding said symbol string S as in claim 14 to produce a polynomial f(x);

F. repeating steps A through D substituting f(x) for the generator polynomial until the matrix contains (2)(q-n) rows;

G. if L is greater than two, encoding said symbol string S' as in claim 14 to produce a polynomial f'(x) and repeating steps A through D, substituting f'(x) for f(x), until the matrix contains (3)(q-n) rows;

H. repeating step G with said symbol string S' being lengthened by one all-ZERO symbol with each repetition until the matrix contains (L)(g-n) rows;

I. forming the pseudo inverse of said matrix by using row reduction to manipulate said matrix into a form as close as possible to the identity matrix;

J. forming the d+1 column of said modifier table by using each of the first nd rows of said pseudo inverted matrix as the q-n bits of a resulting entry in the d+1 column of the table, said q-n bits corresponding to the symbol bits which are not the n selected bits;

K. producing q-bit d+1 column table entries by combining the q-n bits of said resulting entries and said selected n-bit truncation pattern;

L. encoding each said d+1 column entry by the same apparatus used to encode in claim 17 to produce d entries for the rows of said table where each row consists of said d+1 column entry, said d column entries, and all ZERO entries for the remaining L−1 columns;

M. forming the d+2 column of said modifier table by using each of the second nd rows of said pseudo inverted matrix and repeating steps J–L;

N. repeating step M to form the remaining L−3 columns and associated rows of said modifier table.

* * * * *